(12) United States Patent
Noda

(10) Patent No.: US 10,578,660 B2
(45) Date of Patent: Mar. 3, 2020

(54) REACTANCE MEASUREMENT APPARATUS

(71) Applicant: ISUZU MOTORS LIMITED, Shinagawa-ku, Tokyo (JP)

(72) Inventor: Masafumi Noda, Kawasaki (JP)

(73) Assignee: ISUZU MOTORS LIMITED, Tokyo (JP)

(*) Notice: Subject to any disclaimer, the term of this patent is extended or adjusted under 35 U.S.C. 154(b) by 69 days.

(21) Appl. No.: 16/060,584

(22) PCT Filed: Dec. 7, 2016

(86) PCT No.: PCT/JP2016/086439
§ 371 (c)(1),
(2) Date: Jun. 8, 2018

(87) PCT Pub. No.: WO2017/099147
PCT Pub. Date: Jun. 15, 2017

(65) Prior Publication Data
US 2019/0227106 A1 Jul. 25, 2019

(30) Foreign Application Priority Data
Dec. 10, 2015 (JP) .................. 2015-241374

(51) Int. Cl.
*G01R 27/02* (2006.01)
*G01R 27/26* (2006.01)

(52) U.S. Cl.
CPC ......... *G01R 27/2605* (2013.01); *G01R 27/02* (2013.01)

(58) Field of Classification Search
CPC .................. G01R 27/02; G01R 27/2605
See application file for complete search history.

(56) References Cited

U.S. PATENT DOCUMENTS

| | | | |
|---|---|---|---|
| 4,418,569 A | 12/1983 | Kuhnel | |
| 6,147,885 A * | 11/2000 | Brand ............. | H02M 1/4208 363/78 |
| 8,378,619 B2 * | 2/2013 | Hancock ........... | H02P 1/44 318/727 |
| 9,110,106 B2 * | 8/2015 | Kitano ............. | G01R 25/00 |
| 2011/0001450 A1 * | 1/2011 | Hancock ........... | H02P 1/44 318/785 |

(Continued)

FOREIGN PATENT DOCUMENTS

| CN | 1763551 A | 4/2006 |
|---|---|---|
| CN | 102187210 A | 9/2011 |

(Continued)

OTHER PUBLICATIONS

International Search Report and Written Opinion for related International Application No. PCT/JP2016/086439, dated Feb. 21, 2017; 9 pages; English translation of ISR provided.

(Continued)

*Primary Examiner* — Alesa Allgood
(74) *Attorney, Agent, or Firm* — Procopio, Cory, Hargreaves & Savitch LLP

(57) ABSTRACT

A reactance measurement apparatus has a series circuit has a first circuit including a first resistor and a second circuit including a reactance element, a first voltage generation unit for generating a first AC voltage to apply the same to the series circuit, a second voltage generation unit for generating a second AC voltage having a phase difference with respect to the first AC voltage, a multiplication unit for multiplying the second AC voltage and a second circuit voltage to generate a multiplication voltage, a measurement unit for measuring a voltage of a DC component of the multiplication voltage, a phase shift amount calculation unit for calculating a phase shift amount, and a reactance calculation unit for calculating a reactance of the reactance element based on the phase shift amount.

4 Claims, 5 Drawing Sheets

(56) References Cited

U.S. PATENT DOCUMENTS

| | | |
|---|---|---|
| 2011/0285410 A1 | 11/2011 | Aoki |
| 2011/0303556 A1 | 12/2011 | Chen et al. |
| 2012/0291632 A1 | 11/2012 | Nishijima |
| 2013/0320852 A1* | 12/2013 | Kitano .................. G01R 25/00 315/111.21 |
| 2014/0123774 A1 | 5/2014 | Tanoue et al. |
| 2014/0238133 A1 | 8/2014 | Kishiro |
| 2014/0367261 A1 | 12/2014 | Chen |
| 2015/0276889 A1 | 10/2015 | Osaka et al. |
| 2016/0028095 A1 | 1/2016 | Sakai |

FOREIGN PATENT DOCUMENTS

| | | |
|---|---|---|
| CN | 102818822 A | 12/2012 |
| CN | 102959187 A | 3/2013 |
| CN | 103597359 A | 2/2014 |
| CN | 103842831 A | 6/2014 |
| CN | 104597328 A | 5/2015 |
| CN | 105008937 A | 10/2015 |
| JP | S48-032570 A | 4/1973 |
| JP | S56-084521 A | 7/1981 |
| JP | H04-109174 A | 4/1992 |
| JP | H07-229941 A | 8/1995 |
| JP | 2011-153581 A | 8/2011 |
| JP | 2011-169205 A | 9/2011 |

OTHER PUBLICATIONS

CN Office Action for related CN App No. 201680071961.9, dated Jan. 6, 2020; English translation provided. 14 pages.

* cited by examiner

[Fig. 1]
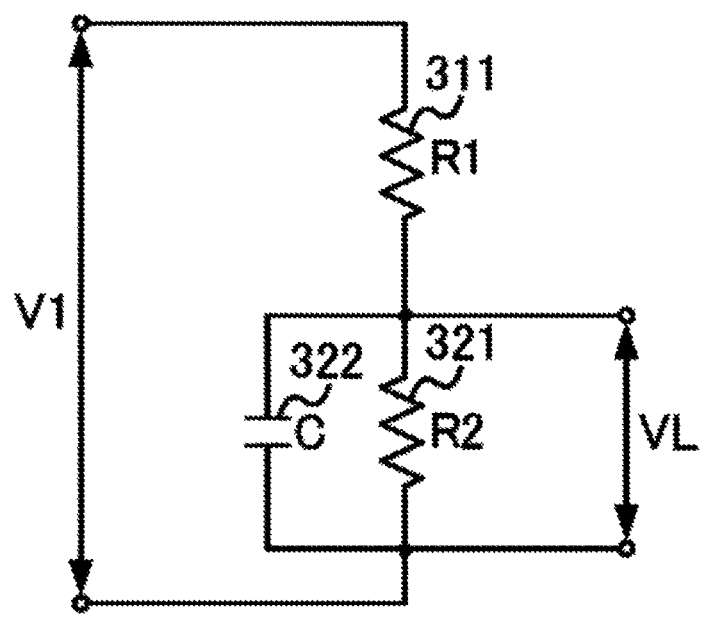

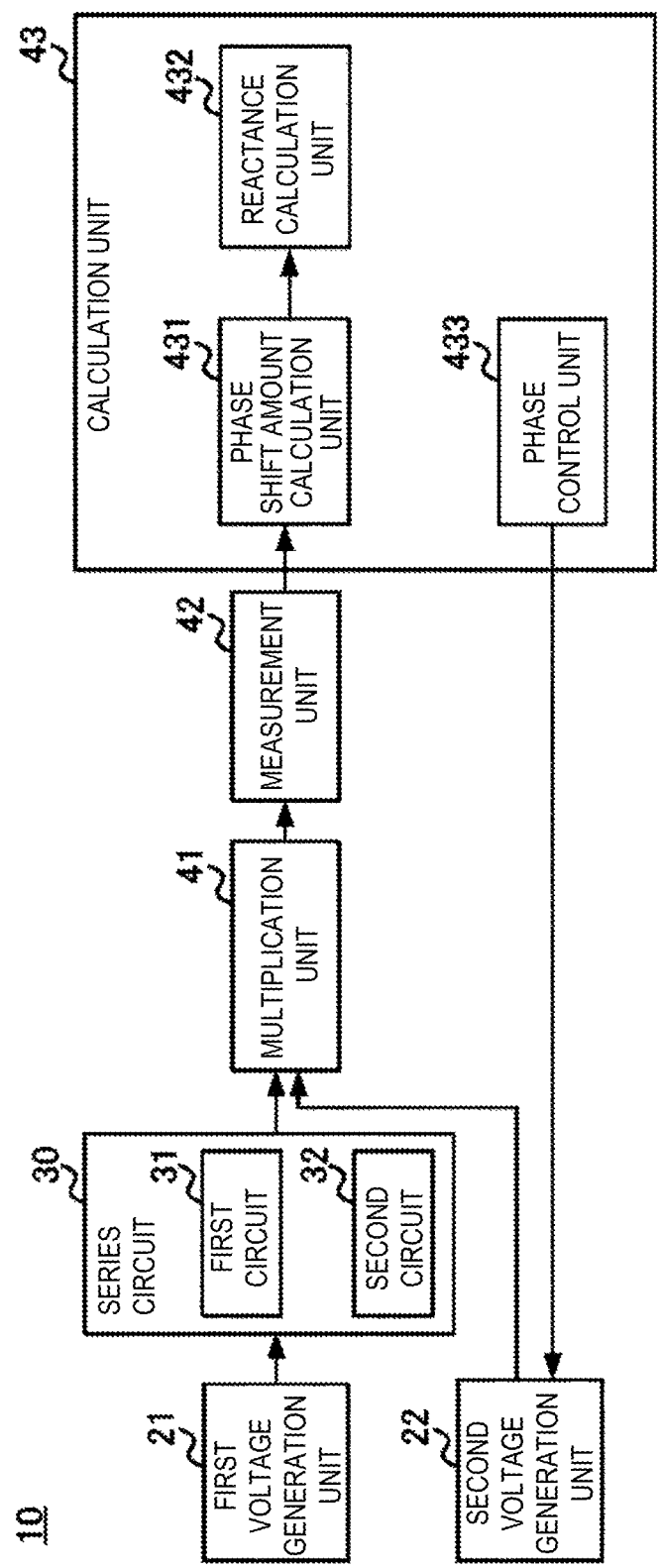
[Fig. 2]

[Fig. 3]
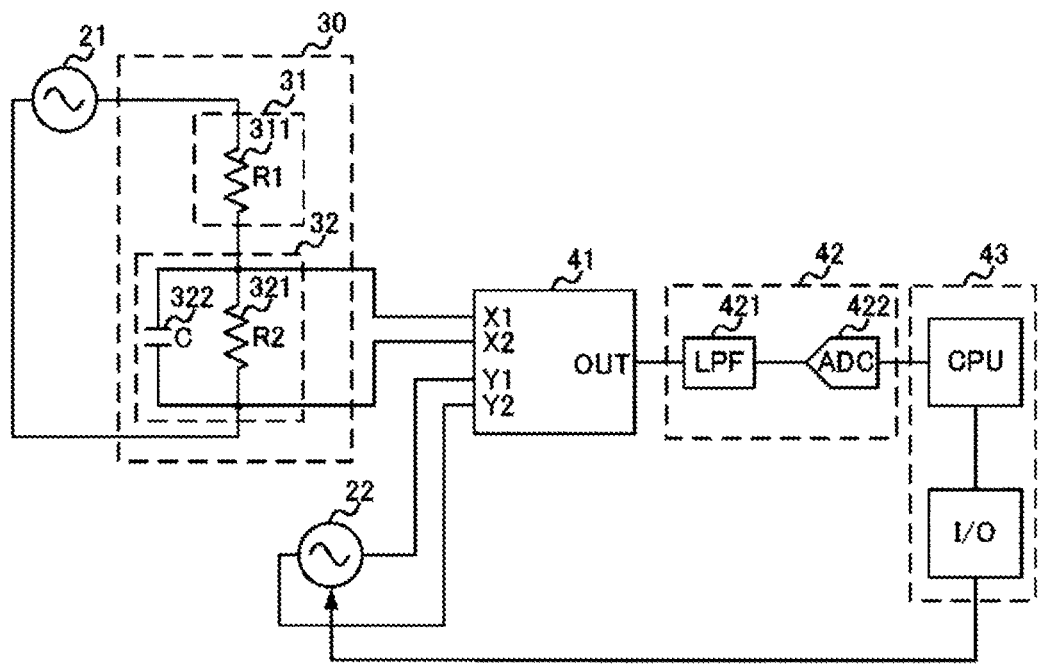

[Fig. 4]
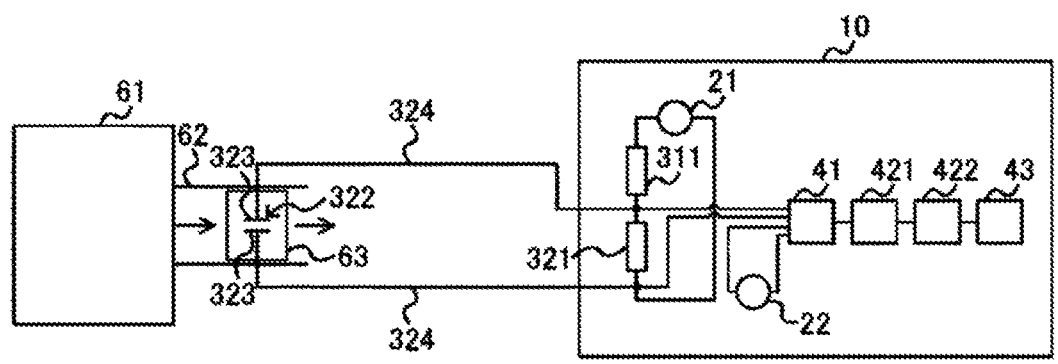

[Fig. 5]
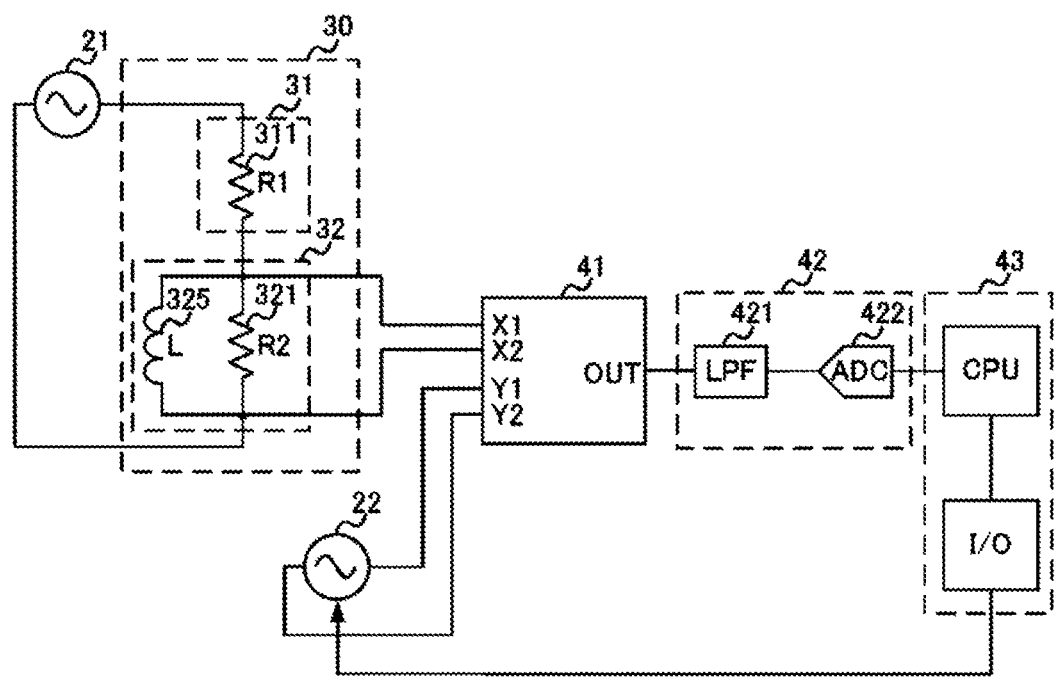

REACTANCE MEASUREMENT APPARATUS

CROSS-REFERENCE TO RELATED APPLICATIONS

This application is a U.S. National Stage of PCT Application No: PCT/JP2016/086439 filed on Dec. 07, 2015, which claims priority to Japanese Patent Application No. 2015-241374, filed Dec. 10, 2015, the contents of which are incorporated herein by reference.

TECHNICAL FIELD

The present disclosure relates to a reactance measurement apparatus which measures reactance of a reactance element.

BACKGROUND ART

In the related art, a reactance measurement apparatus is known which measures reactance of a reactance element. The reactance element indicates a capacitor having capacitive reactance or an inductor having an inductive reactance. For example, patent literature 1 discloses an apparatus which measures the capacitive reactance of the capacitor at predetermined angular frequency and calculates electrostatic capacitance of the capacitor.

First, the apparatus described in patent literature 1 applies a first AC voltage having predetermined amplitude to the capacitor and converts current flowing in the capacitor into a voltage signal at that time. Subsequently, by using a multiplication circuit, the above-described voltage signal is multiplied by the second AC voltage in which the phase is advanced by $\pi/2$ with respect to the first AC voltage. Subsequently, voltage of a DC component in output voltage of the multiplication circuit is measured, and the electrostatic capacitance of the capacitor is calculated based on a relational equation established between magnitude of the DC component and the electrostatic capacitance of the capacitor.

CITATION LIST

Patent Document

[Patent Literature 1]: JP-A-H07-229941

SUMMARY OF THE INVENTION

Technical Problem

In the apparatus described in patent literature 1, a amplitude value of the first AC voltage and a amplitude value of the second AC voltage are expressed in the relational equation established between the magnitude of the DC component and the electrostatic capacitance of the capacitor. For this reason, the calculated value of the electrostatic capacitance is easily affected by a noise superimposed on the first AC voltage or the second AC voltage.

In this regard, the disclosure has been made in consideration of the above situation, and an object thereof is to provide a reactance measurement apparatus which can restrain susceptibility to a noise.

Solution to Problem

In an aspect to the disclosure, there is provided a reactance measurement apparatus which includes: a series circuit that includes a first circuit including a first resistor and a second circuit connected in series with the first circuit and including a reactance element; a first voltage generation unit that generates a first AC voltage having predetermined frequency to apply the first AC voltage to the series circuit; a second voltage generation unit that generates a second AC voltage having the same frequency as that of the first AC voltage and having a predetermined phase difference with respect to the first AC voltage; a multiplication unit that multiplies the second AC voltage and a voltage of the second circuit to generate a multiplication voltage; a measurement unit that measures a voltage of a DC component of the multiplication voltage; a phase shift amount calculation unit that calculates a phase shift amount of the voltage of the second circuit with respect to the first AC voltage based on a relation between a phase difference of the second AC voltage with respect to the first AC voltage and the voltage of the DC component of the multiplication voltage; and a reactance calculation unit that calculates a reactance of the reactance element based on the phase shift amount, which is calculated by the phase shift amount calculating unit, of the voltage of the second circuit with respect to the first AC voltage.

The second circuit may include a second resistor connected in parallel with the reactance element. In this case, the second circuit may include a pair of electric wires which connect the reactance element with the second resistor in parallel. In this case, the reactance element may be disposed in a diesel particulate filter provided in a discharge passage of an exhaust gas emitted from an internal combustion engine, and may include a pair of electrodes connected in parallel with the second resistor via the pair of electric wires.

Advantageous Effects of the Invention

According to the disclosure, it can be restrained that the measurement result of the reactance of the reactance element by the reactance measurement apparatus is affected by the noise.

BRIEF DESCRIPTION OF THE DRAWINGS

FIG. 1 is a view illustrating a circuit including a reactance element.

FIG. 2 is a block diagram illustrating a configuration of a reactance measurement apparatus according to an embodiment.

FIG. 3 is a circuit diagram illustrating the configuration of the reactance measurement apparatus according to the embodiment.

FIG. 4 is a view illustrating a vehicle in which the reactance measurement apparatus is embedded.

FIG. 5 is a circuit diagram illustrating a configuration of a reactance measurement apparatus according to one modification of the embodiment.

DESCRIPTION OF EMBODIMENTS

[Measurement Principle]

First, a principle in which a reactance measurement apparatus according to this embodiment measures reactance of a reactance element will be described with reference to FIG. 1. FIG. 1 is a view illustrating a circuit including the reactance element which is a measurement target. In this embodiment, an example will be described in which the reactance element is a capacitor 322 having electrostatic capacitance C. The circuit includes a first resistor 311 having a resistance value R1, a second resistor 321 having a resistance value R2, and a capacitor 322 having electrostatic capacitance C. The first resistor 311 is connected in series with the capacitor 322. The second resistor 321 is connected in parallel with the capacitor 322.

In this embodiment, at first, a first AC (Alternating Current) voltage V1 of a sine function expressed by equation (1) is applied to the circuit.

$$V1 = a1 \cdot \sin(\omega t) \quad (1)$$

In this case, voltage VL of the capacitor 322 is expressed by equation (2).

$$VL = b \cdot \sin(\omega t + \theta) \quad (2)$$

$\theta$ indicates a phase shift amount, which is caused by the capacitor 322, of the voltage VL with respect to the first AC voltage V1.

Relational equation (3) is established between a phase shift amount $\theta$ of the voltage VL with respect to the first AC voltage V1 and reactance X of the capacitor 322 in an angular frequency $\omega$.

$$\tan \theta = -R1R2/\{X(R1+R2)\} \quad (3)$$

As described in equation (4) obtained by modifying equation (3), the reactance X of the capacitor 322 can be calculated when the phase shift amount $\theta$ is known.

$$X = -R1R2/\{\tan \theta (R1+R2)\} \quad (4)$$

Relational equation (5) is established between the reactance X and the electrostatic capacitance C of the capacitor 322.

$$X = 1/(\omega C) \quad (5)$$

Accordingly, as described in equation (6), the electrostatic capacitance C of the capacitor 322 can be calculated when the phase shift amount $\theta$ is known.

$$C = -\{\tan \theta (R1+R2)\}/(\omega R1R2) \quad (6)$$

Subsequently, the description will be given about a method of calculating the above-described phase shift amount $\theta$. At first, a second AC voltage V2 is generated which has the same angular frequency $\omega$ as that is the first AC voltage V1 and has a phase difference $\alpha$ with respect to the first AC voltage V1.

$$V2 = a2 \cdot \sin(\omega t + \alpha) \quad (7)$$

Subsequently, the second AC voltage V2 is multiplied with the voltage VL applied to the capacitor 322. A multiplication voltage VX obtained as a result of the multiplication is expressed by equation (8).

$$VX = (a2 \cdot b/2) \cdot \{\cos(\alpha - \theta) - \cos(2\omega t + \alpha - \theta)\} \quad (8)$$

The multiplication voltage VX includes an AC component AC which is changed in the angular frequency $2\omega$ according to the time and a DC (Direct Current) component DC which is not changed according to the time.

$$AC = -(a2 \cdot b/2) \cdot \cos(2\omega t + \alpha - \theta) \quad (9)$$

$$DC = (a2 \cdot b/2) \cdot \cos(\alpha - \theta) \quad (10)$$

Subsequently, the DC component DC is extracted from the multiplication voltage VX to measure the voltage of the DC component DC. For example, by using a low pass filter having cut-off frequency which is sufficiently lower than the angular frequency $2\omega$, the AC component AC is removed from the multiplication voltage VX to measure the voltage of the DC component DC.

As understood from equation (10), for example, the voltage of the DC component DC is changed according to the value of $(\alpha - \theta)$ as below.

A maximum value is indicated when $(\alpha - \theta) = 0$.

A line of DC=0 intersects from positive to negative before and after $(\alpha - \theta) = \pi/2$.

A minimum value is indicated when $(\alpha - \theta) = \pi$.

The line of DC=0 intersects from negative to positive before and after $(\alpha - \theta) = 3\pi/2$.

Accordingly, the phase shift amount $\theta$ can be calculated based on a relation between the phase difference $\alpha$ and the voltage of the DC component DC. For example, the phase shift amount $\theta$ can be calculated by searching the phase difference $\alpha$ when the voltage of the DC component DC indicates a maximum value.

In addition, the phase shift amount $\theta$ can be calculated based on the result obtained when the data of the voltage of the DC component DC obtained in a case where the phase difference $\alpha$ is changed in a range of 0 to $2\pi$ is approximated to the sine function by the method such as a least-squares method.

Based on the phase shift amount $\theta$ calculated by the above-described method, the reactance X and the electrostatic capacitance C of the capacitor 322 can be calculated by using equation (4) and equation (6).

According to the above-described method, the phase shift amount $\theta$ can be calculated based on a relative relation between the phase difference $\alpha$ and the voltage of the DC component DC. For this reason, the calculation result of the phase shift amount $\theta$ is hardly affected by the variation, which is caused by the noise, of the voltage of the DC component DC and by the measurement difference of the voltage of the DC component DC. Accordingly, the reactance X and the electrostatic capacitance C of the capacitor 322 can be calculated accurately.

[Configuration of Reactance Measurement Apparatus]

Hereinafter, the configuration of the reactance measurement apparatus which measures the reactance of the reactance element will be described based on the above-described measurement principle. FIG. 2 is a block diagram illustrating a reactance measurement apparatus 10 according to this embodiment. In addition, FIG. 3 is a circuit diagram illustrating the reactance measurement apparatus 10 according to this embodiment.

The reactance measurement apparatus 10 includes a first voltage generation unit 21, a second voltage generation unit 22, a series circuit 30, a multiplication unit 41, a measurement unit 42, and a calculation unit 43. Hereinafter, the description will be given about the components of the reactance measurement apparatus 10.

The first voltage generation unit 21 includes a direct digital synthesizer (DDS), for example. The first voltage generation unit 21 generates the first AC voltage V1 having predetermined angular frequency $\omega$ and applies the first AC voltage to the series circuit 30.

The second voltage generation unit 22 has the same angular frequency $\omega$ as that of the first AC voltage V1, and generates the second AC voltage V2 having predetermined phase difference $\alpha$ with respect to the first AC voltage V1. For example, based on the control information which a MPU (to be described later) outputs via an I/O port, the second voltage generation unit 22 can set the phase difference $\alpha$ to an arbitrary value of 0 to $2\pi$ and generate the second AC voltage V2.

In a case where the DDS including plural cores is used, a first core can be used to generate the first AC voltage V1, and a second core can be used to generate the second AC voltage V2.

The series circuit 30 includes a first circuit 31 and a second circuit 32. The second circuit 32 is connected in series with the first circuit 31. As illustrated in FIG. 3, the first circuit 31 includes the above-described first resistor 311. The second circuit 32 includes the above-described second resistor 321 and the capacitor 322 as the reactance element.

The multiplication unit 41 is an analog multiplier, for example. The multiplication unit 41 multiplies voltage between an input terminal X1 and an input terminal X2 with voltage between an input terminal Y1 and an input terminal Y2, and outputs the multiplication voltage VX obtained as a result of the multiplication from an output terminal OUT.

The input terminals X1 and X2 of the multiplication unit 41 are connected with the second circuit 32 to measure the voltage VL of the second circuit 32 including the capacitor 322. Incidentally, "the voltage of the second circuit 32" indicates the voltage between two points of the second circuit 32 with at least capacitor 322 interposed therebetween. For example, the input terminals X1 and X2 of the multiplication unit 41 are connected with both ends of the capacitor 322 of the second circuit 32. In addition, the input terminals Y1 and Y2 of the multiplication unit 41 are connected with both ends of the second voltage generation unit 22. By using the multiplication unit 41 connected as above, the multiplication voltage VX can be obtained by multiplying the voltage (hereinafter, referred to as second circuit voltage) VL of the second circuit 32 and the second AC voltage V2 of the second voltage generation unit 22.

For example, the measurement unit 42 includes a low pass filter 421 and an AD converter 422. The input terminal of the low pass filter 421 is connected with the output terminal OUT of the multiplication unit 41, and the output terminal of the low pass filter 421 is connected with the input terminal of the AD converter 422. The low pass filter 421 has cut-off frequency lower than the angular frequency $2\omega$ of the multiplication voltage VX. For this reason, the low pass filter 421 can remove the AC component AC from the multiplication voltage VX having the AC component AC and the DC component DC and input the DC component DC to the AD converter 422. The AD converter 422 measures the voltage of the DC component DC. The AD converter 422 inputs the measurement result of the voltage of the DC component DC as a digital signal to the calculation unit 43.

For example, the calculation unit 43 is formed of a MCU including a CPU and the I/O port. By executing a program stored in a storage medium (not illustrated), the calculation unit 43 functions as a phase shift amount calculation unit 431, a reactance calculation unit 432, and a phase control unit 433.

The phase shift amount calculation unit 431 calculates the phase shift amount $\theta$ of the second circuit voltage VL of the capacitor 322 of the second circuit 32 with respect to the first AC voltage V1 based on the relation between the phase difference $\alpha$ of the second AC voltage V2 with respect to the first AC voltage V1 and the voltage of the DC component DC of the multiplication voltage VX. For example, the phase shift amount calculation unit 431 searches the phase difference $\alpha$ in which the voltage of the DC component DC indicates the maximum value, and calculates the phase shift amount $\theta$. The reactance calculation unit 432 calculates the reactance X and the electrostatic capacitance C of the capacitor 322 by using equation (4) and equation (6) based on the phase shift amount $\theta$ calculated by the phase shift amount calculation unit 431.

The phase control unit 433 controls the phase difference of the second AC voltage V2 with respect to the first AC voltage V1. Specifically, the phase control unit 433 sets the phase difference $\alpha$ of the second AC voltage V2 which is output by the second voltage generation unit 22 with respect to the second voltage generation unit 22. For example, the phase control unit 433 outputs the control information corresponding to the phase difference $\alpha$ to the second voltage generation unit 22 via an output port.

[Operation of Reactance Measurement Apparatus]

Hereinafter, the description will be given about the operation of the reactance measurement apparatus 10.

First, the first voltage generation unit 21 generates the first AC voltage V1 and applies the first AC voltage to the series circuit 30. As a result, the second circuit voltage VL having the phase shift amount $\theta$ with respect to the first AC voltage V1 is generated in the second circuit 32 of the series circuit 30. The second circuit voltage VL is input to the multiplication unit 41.

Subsequently, the second voltage generation unit 22 generates the second AC voltage V2 and inputs the second AC voltage to the multiplication unit 41. The multiplication unit 41 multiplies the first AC voltage V1 with the second circuit voltage VL to generate the multiplication voltage VX, and inputs the multiplication voltage VX to the low pass filter 421 of the measurement unit 42.

The low pass filter 421 removes the AC component AC from the multiplication voltage VX to extract the DC component DC, and inputs the DC component DC to the AD converter 422. The AD converter 422 measures the voltage of the DC component DC, and inputs the measurement result to the calculation unit 43.

The phase shift amount calculation unit 431 of the calculation unit 43 searches the phase difference $\alpha$ in which the voltage of the DC component DC indicates the maximum value, and calculates the phase shift amount $\theta$. The reactance calculation unit 432 calculates the reactance X and the electrostatic capacitance C of the capacitor 322 by using equation (4) and equation (6) based on the phase shift amount $\theta$ calculated by the phase shift amount calculation unit 431.

[Application of Reactance Measurement Apparatus]

Next, the description will be given about one application of the reactance measurement apparatus 10 according to this embodiment. Herein, an example will be described in which the reactance measurement apparatus 10 is used to detect a deposition amount of a particulate substance (hereinafter, referred to as a PM) such as soot in a diesel particulate filter (hereinafter, referred to as a DPF) provided in a discharge passage of an exhaust gas, which is disposed from an internal combustion engine to an atmosphere.

FIG. 4 is a view illustrating a vehicle 1 into which the reactance measurement apparatus 10 is embedded. In the example illustrated in FIG. 4, a pair of electrodes indicated by a reference numeral 323 correspond to the capacitor 322 which is a target for measuring the reactance and the electrostatic capacitance by using the reactance measurement apparatus 10. For example, the pair of electrodes are the electrodes of the sensor for detecting the deposition amount of the PM in the DPF.

The pair of electrodes 323 are configured such that the deposition amount of the PM in a DPF 63 one-to-one corresponds the electrostatic capacitances between the pair of electrodes 323. For example, similarly to the case of JP-A-2011-153581 (the contents thereof are incorporated hereinto by reference.) which is a prior application by the present inventors, the pair of electrodes 323 are a pair of cylindrical electrodes which are coaxially arranged to face each other in a radial direction. In addition, the pair of electrodes 323 may be mesh-shaped electrodes which are arranged to face each other in a flowing direction of the exhaust gas.

Hereinafter, the description will be given about an advantage of the configuration of the vehicle 1 and an advantage of embedding the reactance measurement apparatus 10 into the vehicle 1.

The vehicle 1 includes the reactance measurement apparatus 10, the internal combustion engine 61, a discharge passage 62, and the DPF 63. The reactance measurement apparatus 10 includes a circuit substrate mounted with components such as the first resistor 311 and the second resistor 321.

For example, the internal combustion engine 61 is a diesel engine. The discharge passage 62 discharges the exhaust gas generated in the internal combustion engine 61. The DPF 63 is provided in the discharge passage 62. The DPF 63 collects the PM included in the exhaust gas. The PM deposited in the DPF 63 can be combusted and removed by raising the temperature of the DPF 63.

The pair of electrodes 323 are disposed inside the DPF 63. The pair of electrodes 323 are connected in parallel with the second resistor 321 on the circuit substrate of the reactance measurement apparatus 10 via the pair of electric wires 324. For example, the electric wire 324 is formed as a wire harness. By connecting the second resistor 321 on the circuit substrate and the electrodes 323 via the electric wire 324, it can be restrained that the heat of the DPF 63 affect the component of the reactance measurement apparatus 10 mounted on the circuit substrate.

The PM flowing through the discharge passage 62 is deposited between the pair of electrodes 323. In this case, the electrostatic capacitance between the pair of electrodes 323 changes according to the deposition amount of the PM deposited between the pair of electrodes 323. Accordingly, the deposition amount of the PM between the pair of electrodes 323 is calculated when the reactance measurement apparatus 10 is used to measure the electrostatic capacitance between the pair of electrodes 323. The deposition amount of the PM inside the DPF 63 can be estimated based on the result. In addition, a timing of combusting the PM deposited in the DPF 63 can be properly controlled based on the estimation value of the deposition amount of the PM inside the DPF 63.

<Advantageous Effects of the Embodiment>

First, the reactance measurement apparatus 10 according to this embodiment applies the first AC voltage V1 to the series circuit 30 which includes the first circuit 31 including the first resistor 311 and the second circuit 32 including the capacitor 322 and obtains the second circuit voltage VL in which the phase shift amount θ caused by the capacitor 322 generates with respect to the first AC voltage V1. Subsequently, the second circuit voltage VL and the second AC voltage V2 having the phase difference α with respect to the first AC voltage V1 are multiplied to obtain the multiplication voltage VX including the AC component AC which changes at the angular frequency 2ω according to the time and the DC component DC which does not change according to the time. Subsequently, the low pass filter or the like is used to remove the AC component AC from the multiplication voltage VX to extract the DC component DC, and measures the voltage of the DC component DC. Subsequently, the phase shift amount θ of the second circuit voltage VL caused by the capacitor 322 is calculated based on the relation between the voltage of the DC component DC and the phase difference α of the second AC voltage V2 with respect to the first AC voltage V1. Subsequently, the reactance X and the electrostatic capacitance C of the capacitor 322 are calculated based on the phase shift amount θ.

In a case where the phases of VL and V2 are analyzed as above to calculate the reactance X and the electrostatic capacitance C, the measurement value of the reactance is not sensitive with respect to the variation of the amplitude of V1 and V2. Therefore, a signal having such magnitude that obtains a sufficient SN ratio may be generated. There is no need to control the amplitude and to consider the change of the amplitude due to a secular change, whereby simplifying a structure of an oscillator.

In addition, there is no need to measure the amplitude of V1 and V2, thereby simplifying the configuration of hardware and software.

In addition, the measurement value itself in a certain phase difference of V2 with respect to V1 of the voltage of the DC component DC is not directly reflected to the values of the reactance X and the electrostatic capacitance C. For this reason, it can be restrained that the calculation values of the reactance X and the electrostatic capacitance C are varied by the effect of the variation, which is caused by the noise, of the voltage of the DC component DC. In addition, it can be restrained that the calculation accuracy of the values of the reactance X and the electrostatic capacitance C is reduced by the effect of the measurement difference of each of the voltages of the DC component DC.

In addition, the second circuit 32 of the reactance measurement apparatus 10 includes the second resistor 321 connected in parallel with the capacitor 322. For this reason, impedance of the second circuit 32 with respect to the noise can be reduced. Thus, it can be restrained that the calculation values of the reactance X and the electrostatic capacitance C are varied by the effect of the noise superimposed on the DC component DC. The above operation of the second resistor 321 is remarkably effective in a case where the capacitor 322 is connected with the circuit substrate via the pair of electric wires 324, and thus the noise is easily superimposed with the second circuit voltage VL via the electric wire 324.

In addition, when the capacitor 322 is connected in parallel with the second resistor 321 via the pair of electric wires 324, circuit elements such as the first resistor 311 and the second resistor 321 can be spaced apart from the capacitor 322. For this reason, it can be restrained that the circuit elements such as the first resistor 311 and the second resistor 321 are affected by the heat in a range of the capacitor 322 and the capacitor 322. Accordingly, it is possible to accurately calculate the reactance X and the electrostatic capacitance C between the pair of electrodes 323 disposed inside a high-temperature component such as the DPF 63 of the vehicle 1.

Hereinbefore, an aspect of the disclosure has been described by using the embodiment. However, the technical range of the invention is not limited to the range described in the embodiment. It is apparent to those skilled in the art that various changes or improvements can be made in the embodiment. It is apparent from the appended claims that the embodiment thus changed or improved can also be included in the technical range of the invention.

(Example in which the Reactance Element is Inductor)

For example, in this embodiment, the example has been described in which the reactance element which is a measurement target of the reactance is the capacitor 322 being composed of the electrostatic capacitance C. However, the invention is not limited thereto. Even in a case where the reactance element is an inductor, the reactance measurement apparatus 10 can measure the reactance X thereof and inductance L. Hereinafter, this modification will be described with reference to FIG. 5. FIG. 5 is a circuit diagram illustrating the configuration of the reactance measurement apparatus 10 according to this modification.

The circuit according to this modification includes the first resistor 311 having the resistance value R1, the second resistor 321 having the resistance value R2, and an inductor 325 having the inductance L. The first resistor 311 is connected in series with the inductor 325. The second resistor 321 is connected in parallel with the inductor 325. The arrangement of the inductor 325 is the same as the above-described arrangement of the capacitor 322 in this embodiment described above. Thus, the above-described relational equation (4) is established between the phase shift amount θ of the second circuit voltage VL with respect to the first AC voltage V1 and the reactance X of the inductor 325.

Relational equation (11) is established between the reactance X of the capacitor 322 and the electrostatic capacitance C.

$$X = \omega L \quad (11)$$

Accordingly, by using the above-described equation (4) and equation (11), the inductance L of the inductor 325 can be calculated as below based on the phase shift amount θ.

$$L = -R1R2/\{(\omega \tan \theta(R1+R2)\} \quad (12)$$

(Another Application of the Reactance Measurement Apparatus)

In this embodiment described above, the example has been described in which the reactance measurement apparatus 10 is embedded into the vehicle 1. However, the application of the reactance measurement apparatus 10 is not limited thereto. For various purposes, the reactance of the reactance element can be calculated by using the reactance measurement apparatus 10.

This application is based upon and claims the benefit of priority from Japanese Patent Application No. 2015-241374, filed on Dec. 10, 2015, the entire contents of which are incorporated herein by reference.

INDUSTRIAL APPLICABILITY

This disclosure is useful in that it can be restrained that the measurement result of the reactance of the reactance element by the reactance measurement apparatus is affected by the noise.

LIST OF REFERENCE NUMERALS

10 reactance measurement apparatus
21 first voltage generation unit
22 second voltage generation unit
30 series circuit
31 first circuit
311 first resistor
32 second circuit
321 second resistor
322 capacitor
323 electrodes
324 electric wires
325 inductor
41 multiplication unit
42 measurement unit
421 low pass filter
422 AD converter
43 calculation unit
431 phase shift amount calculation unit
432 reactance calculation unit
433 phase control unit
61 internal combustion engine
62 discharge passage
63 diesel particulate filter (DPF)

The invention claimed is:

1. A reactance measurement apparatus comprising:
a series circuit that includes a first circuit including a first resistor and a second circuit connected in series with the first circuit and including a reactance element;
a first voltage generation unit that generates a first AC voltage having a predetermined frequency to apply the first AC voltage to the series circuit;
a second voltage generation unit that generates a second AC voltage having the same frequency as that of the first AC voltage and having a predetermined phase difference with respect to the first AC voltage;
a multiplication unit that multiplies the second AC voltage and a voltage of the second circuit to generate a multiplication voltage;
a measurement unit that measures a voltage of a DC component of the multiplication voltage;
a phase shift amount calculation unit that calculates a phase shift amount of the voltage of the second circuit with respect to the first AC voltage based on a relation between a phase difference of the second AC voltage with respect to the first AC voltage and the voltage of the DC component of the multiplication voltage; and
a reactance calculation unit that calculates a reactance of the reactance element based on the phase shift amount, which is calculated by the phase shift amount calculating unit, of the voltage of the second circuit with respect to the first AC voltage.

2. The reactance measurement apparatus according to claim 1,
wherein the second circuit includes a second resistor connected in parallel with the reactance element.

3. The reactance measurement apparatus according to claim 2,
wherein the second circuit includes a pair of electric wires which connect the reactance element with the second resistor in parallel.

4. The reactance measurement apparatus according to claim 3,
wherein the reactance element is disposed in a diesel particulate filter provided in a discharge passage of an exhaust gas emitted from an internal combustion engine, and includes a pair of electrodes connected in parallel with the second resistor via the pair of electric wires.

* * * * *